United States Patent [19]
Dent

[11] Patent Number: 5,749,051
[45] Date of Patent: May 5, 1998

[54] COMPENSATION FOR SECOND ORDER INTERMODULATION IN A HOMODYNE RECEIVER

[75] Inventor: Paul W. Dent, Pittsboro, N.C.

[73] Assignee: Ericsson Inc., Research Triangle Park, N.C.

[21] Appl. No.: 683,384

[22] Filed: Jul. 18, 1996

[51] Int. Cl.[6] .................................................. H04B 1/26
[52] U.S. Cl. ...................................... 455/324; 455/317
[58] Field of Search ................................ 455/324, 295, 455/317, 296

[56] References Cited

U.S. PATENT DOCUMENTS

| | | |
|---|---|---|
| 5,241,702 | 8/1993 | Dent . |
| 5,530,929 | 6/1996 | Lindqvist et al. ............... 455/324 |
| 5,614,904 | 3/1997 | Dent ................................. 455/324 |

*Primary Examiner*—Amelia Au
*Attorney, Agent, or Firm*—Burns, Doane, Swecker & Mathis, L.L.P.

[57] ABSTRACT

A homodyne radio receiving apparatus is provided for mitigating fixed or variable DC offsets produced by residual second order intermodulation terms due to unwanted signals. The homodyne radio receiving apparatus includes an antenna, an antenna by-pass filter, an RF amplifier and a quadrature downconverter. The quadrature downconverter for the complex base band is centered around a desired reception frequency so that the complex baseband signals lie around zero frequency. A supplementary total power detector is provided to measure the total received power through the antenna by-pass filter so that the unwanted terms caused by second order intermodulation are compensated. The compensation is achieved by feeding instantaneous power measurements to a signal processing unit along with the complex baseband signals. The signal processing unit then determines a complex compensation coefficient by correlating the power signal with the complex baseband signals. The complex compensation coefficient is then employed to subtract a weighted amount of the power signal from the complex baseband signals in order to cancel the unwanted second order intermodulation distortion terms.

32 Claims, 3 Drawing Sheets

5,749,051

COMPENSATION FOR SECOND ORDER INTERMODULATION IN A HOMODYNE RECEIVER

BACKGROUND

The present invention relates to homodyne radio receivers, and more particularly, to a device which compensates for unwanted signals due to second order intermodulation terms.

A homodyne receiver is commonly known to be a variation of the superheterodyne receiver. A superheterodyne receiver in general receives signals in a first frequency band, and by mixing the received signals with a locally generated oscillator signal, converts them to a second or intermediate frequency band. By choosing the local oscillator signal to be a constant amount away from a selected, wanted signal in the first frequency band, the selected, wanted signal always appears at the same frequency in the intermediate frequency band. Thereby selection of the selected, wanted signal may be facilitated by a fixed-tuned, intermediate frequency filter.

In the homodyne receiver variation of the superheterodyne receiver, the chosen intermediate frequency band is DC or zero frequency. The local oscillator then has a zero frequency separation from the selected, wanted signal. Any modulation on the selected, wanted signal that causes spectral components both above and below the nominal signal frequency becomes folded at the mixer output, as a component dF below the signal frequency or dF above the signal frequency will appear at the intermediate frequency dF above the nominal of zero. To allow for resolution of such folded components, two mixers are provided in a homodyne receiver using local oscillator signals that are phase offset by 90 degrees. The components above and below the nominal signal frequency then appear folded as I=A+B at one mixer output and Q=j(A−B) at the other mixer output where they may be separated if desired by forming B=(I+jQ)/2 or A=(I−jQ)/2.

Such homodyne receiver operations are described in more detail in U.S. Pat. No. 5,241,702 which is incorporated herein by reference. One problem with operations in known homodyne receivers is that the local oscillator frequency is equal to the desired reception frequency, which leads to the homodyne receiver receiving an interfering component due to radiation from its own local oscillator. When the local oscillator frequency is exactly on the nominal expected frequency, this interfering component becomes converted to exactly zero frequency or DC at the mixer outputs and a large DC offset component is produced which is many orders of magnitude larger than a wanted signal. This interfering component may however be removed by applying a technique comprising in one implementation differentiation of the complex baseband signals output from the quadrature mixers, digitization and then numerical re-integration.

As a result, the problem in known homodyne receivers where the total power let through the antenna bandpass filter, which may include many unwanted signals as well as the wanted signal, has typically been rectified by the square-law distortion term in an RF amplifier or quadrature down converters, leading to a corrupting term being added to the complex baseband signals. This type of corrupting term is most pronounced when interfering signals are amplitude modulated, or of a bursty type, such as TDMA transmissions.

When other strong interfering signals are present at any frequency at the input of the quadrature down converters, such signals can be converted to DC by mixing the signal with themselves through any even order distortion term in the polynomial description of the mixer transfer function. This effect can be minimized by choosing balanced mixer structures and push-pull RF amplifier structures leading to cancellation of even order distortion, of which the most significant term is the square law term, also known as second order intermodulation or IP2. Nevertheless, signals of sufficient strength can still produce fixed or variable DC offsets due to residual IP2 terms from imperfect balance in the balanced structures.

The present invention is directed to a homodyne radio receiving apparatus for mitigating any fixed or variable DC offsets produced by residual IP2 terms in known homodyne receiver operations.

SUMMARY

These and other objectives are achieved in accordance with the present invention by means of a homodyne radio receiving apparatus comprising an antenna, an antenna bandpass filter, an RF amplifier and a quadrature down converter to the complex baseband. In an exemplary embodiment of the invention the local oscillator for the down converter is centered on the desired reception frequency so that the complex baseband signals lie around zero frequency.

Thereby, the apparatus compensates for such unwanted terms caused by second order intermodulation (IP2) by providing a supplementary total power detector to measure the total received power through said antenna bandpass filter. The instantaneous power measurements are fed to a signal processing unit along with said complex baseband signals, where a complex compensation coefficient is determined by correlating the power signal with the complex baseband signals. The coefficient is then employed in subtracting a weighted amount of said power signal from said complex baseband signals in order to cancel the unwanted IP2 distortion term. Thereby, the present invention cancels the effect of IP2 interference in homodyne radio receiving apparatus.

BRIEF DESCRIPTION OF THE DRAWINGS

The present invention will become more fully understood from the detailed description given hereinbelow and the accompanying drawings which are given by way of illustration only, and thus are not limitative of the present invention, wherein.

DESCRIPTION

The embodiments of the present invention are directed to devices and methods for cancelling unwanted IP2 distortion terms in a homodyne radio receiving apparatus. One embodiment of the present invention for a device which cancels the effect of IP2 interference is shown in a general form in FIG. 1.

Figure 1:
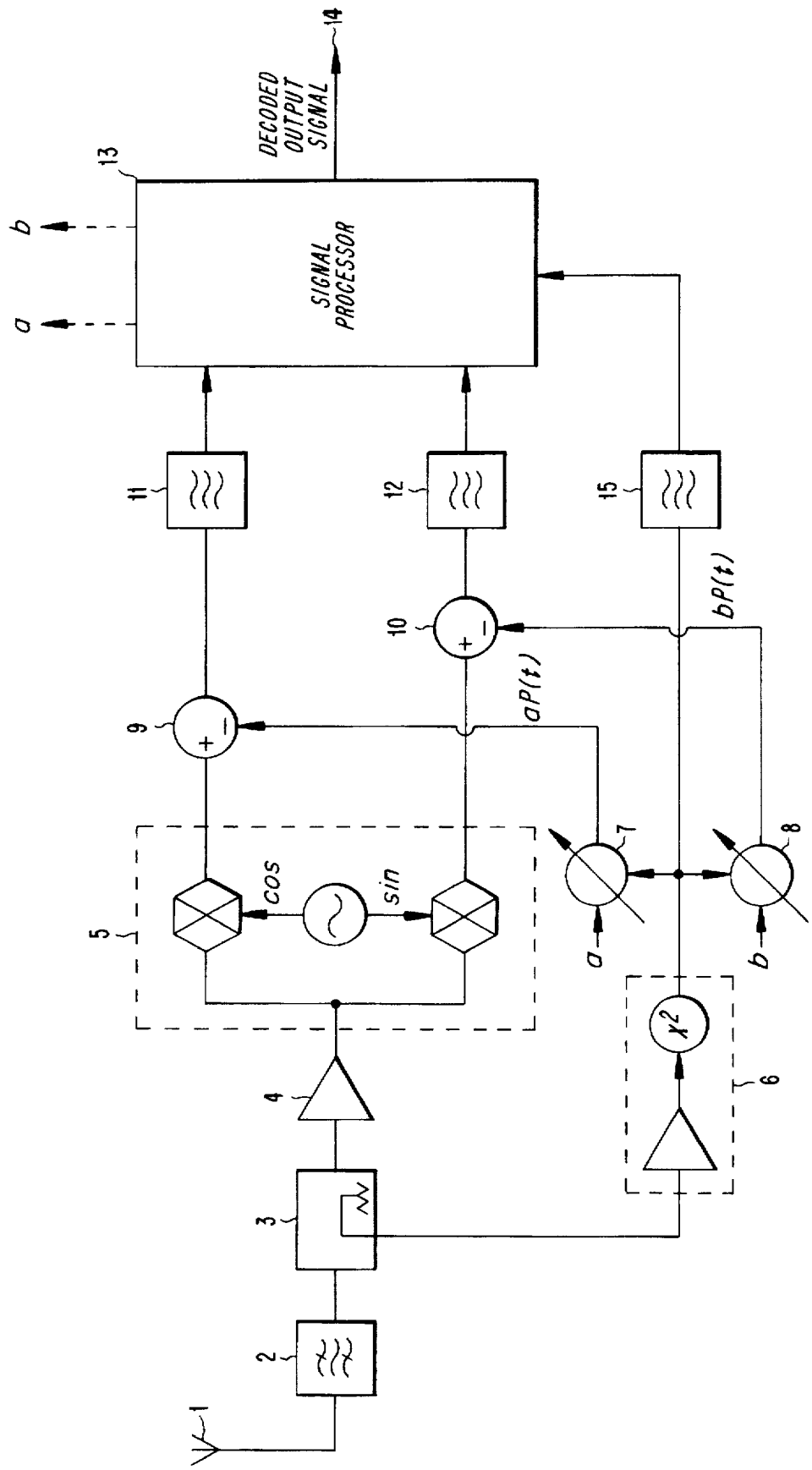
FIG. 1 illustrates a block diagram of a device for cancelling second order intermodulation according to one embodiment of the present invention.

In the embodiment illustrated in FIG. 1, signals are input to the device and received by an antenna (1) in a bandwidth determined by an antenna bandpass filter (2). In one example of the present invention, one portion of the composite signal passed by the antenna bandpass filter (2) is directed by a directional coupler (3) into a power detector (6), while the majority portion of the composite signal is applied to an r.f. amplifier (4) and a quadrature down converter (5). The portion of the composite signal passed by the antenna bandpass filter (2) may also be directed by a signal pick off unit, for example, to the power detector (6). The total power measurement signal waveform P(t) may be produced using a square-law device for the power detector (6), such as a Gilbert multiplier cell, for example, which is suitable for integration into a silicon integrated circuit. In another example, a linear detector may be used as the power detector (6) to produce the total power measurement signal waveform P(t). Weighted amounts of power measurement signal waveform P(t) are formed using weighting units (7,8) responsive to inputted weights "a" and "b" respectively. The weight coefficients (a,b) may be determined and fixed once and for all, as they are related to the IP2 characteristics of the r.f. amplifier (4) and the quadrature down converter (5). On the other hand, the IP2 characteristics are likely to vary from weighting units due to processing and according to its operating temperature. As a result, the weight coefficients (a,b) are preferably adaptively determined by a signal processing unit (13).

The weighted amounts aP(t) and bP(t) of the total power measurement signal waveform P(t) are subtracted from the output of the quadrature down converter (5) using first and second subtractors (9,10) to produce IP2 compensated signals. Alternately, the first and second subtractors (9,10) may be implemented as adders if the signs of the weight coefficients (a,b) are appropriately chosen.

In the present embodiment, the IP2-compensated signals from the first and second subtractors (9,10) are then low-pass filtered in first and second low pass filters (11,12) to establish the passband width for the wanted signal. The filtered, compensated signals are then processed in the signal processing unit (13) to produce a demodulated/decoded wanted output signal (14).

The signal processing unit (13) can, for example, function according to the aforementioned U.S. Pat. No. 5,241,702, which was incorporated by reference above, and may further include DC offset compensation, digitization and digital signal processing. In addition to the functions described in the aforementioned U.S. Pat. No. 5,241,702, the signal processing unit (13) can incorporate a new function according to one embodiment of this invention for adaptively adjusting the weight coefficients (a,b). The new function correlates the power measurement signal waveform P(t) with the compensated output signals from the first and second low pass filters (11,12) to determine the accuracy of the compensation. Accurate compensation would result in no correlation between the compensated signals and the power signal. A non-zero compensation indicates that the weight coefficients (a,b) are in error and the amount of error. The signal processing unit (13) then produces adjusted weight coefficients (a,b) which are fed back to weighting units (7,8) in order to produce an adjusted compensation.

In order to perform this new function with digital signal processing, the power measurement signal P(t) may be low pass filtered using a third low pass filter (15) similar to the first and second low pass filters (11,12) and then analog-to-digitally converted by the signal processing unit 13. For example, a high-bitrate Delta-Sigma modulation may be used to perform this analog-to-digital conversion. Correlation may then be performed by multiplying the digitized power signal with each of the digitized signals from the first and second low pass filters (11,12) after internal reconstruction according to the aforementioned U.S. Pat. No. 5,241, 702. The multiplied values are then time-averaged to determine if there is a net correlation between the power signals and the compensated signals. The signal processing unit (13) is thereby used to optimize control of the output signal (14) by determining residual uncancelled distortion components by correlating the compensated signals aP(t) and bP(t) with the power signal P(t). If the total power signal P(t) is produced by a linear (amplitude) detector, the linear value may of course be squared by numerical processing in the signal processing unit (13) to produce power related value, or alternatively subjected to any order of polynomial transformation adapted to optimize the compensation of IP2 or high order terms.

Figure 2:
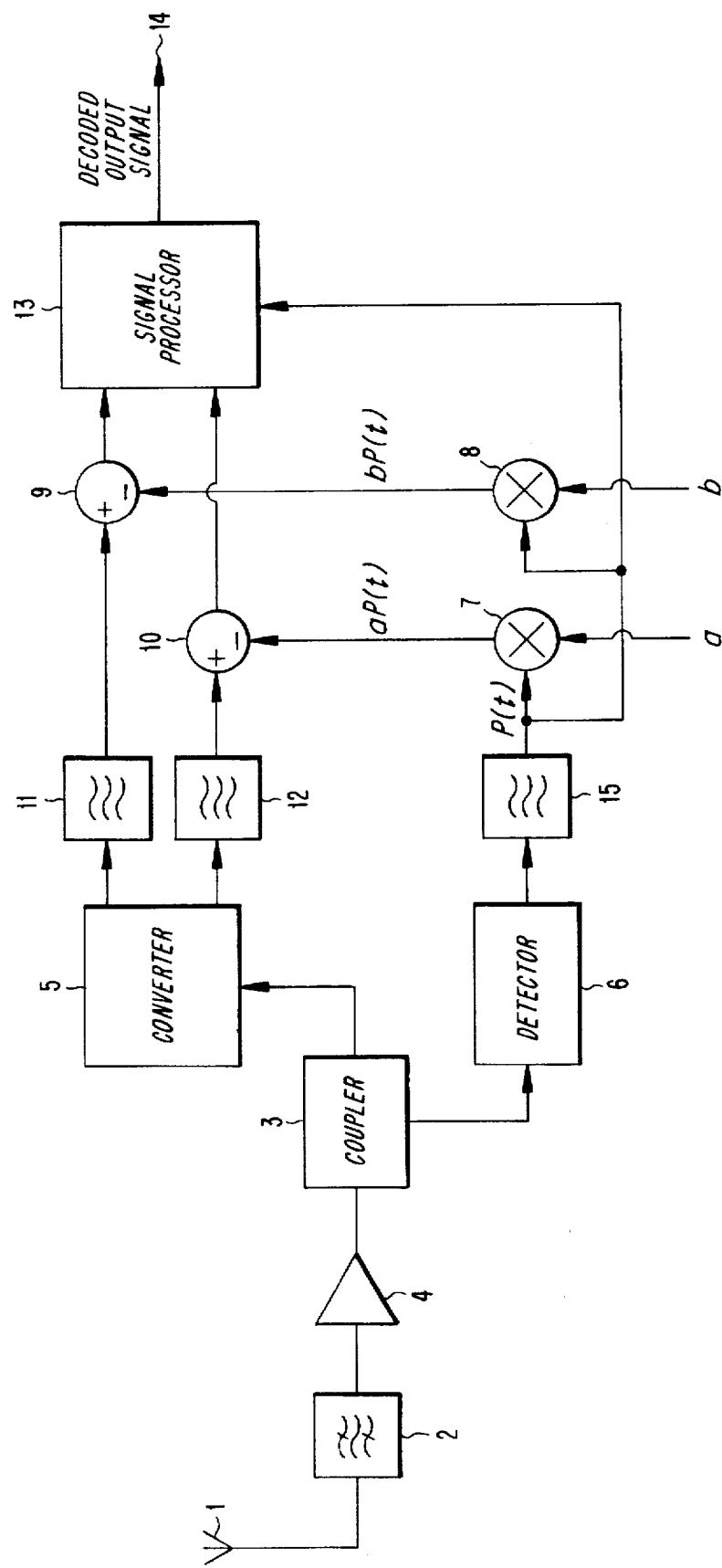
FIG. 2 illustrates a block diagram of a device according to a second embodiment of the present invention.

Also, the signal processing unit (13) compensates for DC offsets present in the output of the downconverter (5). The signal processing unit (13) differentiates and digitizes the compensated signals aP(t) and bP(t) and then performs numerical re-integration of the differentiated and digitized signals to perform the DC offset compensation. The signal processing unit (13) further compensates for DC offset by DC blocking and digitization of the compensated signals aP(t) and bP(t). By estimating errors in the wanted components of the compensated signals aP(t) and bP(t) caused by DC blocking, the signal processing unit (13) may subtract out these estimated errors to compensate for the DC offset In the embodiment illustrated in FIG. 1, certain components may be connected in an alternative order without affecting the basic principles of the device. For example, the down converted signals and the power signal P(t) can be filtered before subtraction. As illustrated in FIG. 2, the first and second low pass filters (11,12) are connected between the quadrature downconverter (5) and the first and second subtractors (9,10). FIG. 2 also illustrates that the power detector (6) can sample the total power signal after amplification by the r.f. amplifier (4) using and a sampler (33).

Figure 3:
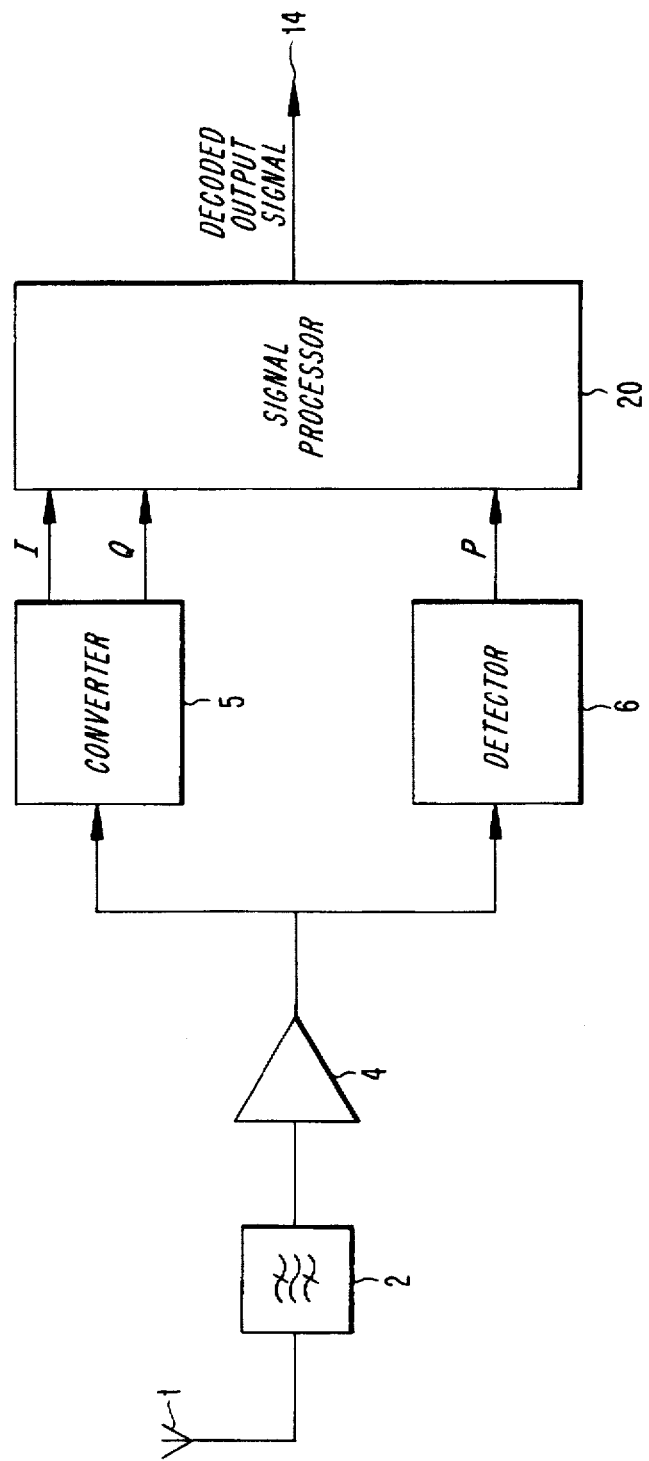
FIG. 3 illustrates a block diagram of a device according to a third embodiment of the present invention.

A second alternative embodiment for this device is illustrated in FIG. 3. Referring to FIG. 3, the signal received using the antenna (1) and band limited by the antenna bandpass filter (2) is amplified by the r.f. amplifier (4). The amplified signal is applied to both quadrature downconverter (5) and the power detector (6). The down converted signals (I,Q) from the quadrature downconverter (5) are applied to a signal processing unit (20) along with the power signal P. The signal processing unit (20) combines the power signal P with the down converted signals (I,Q) to compensate for unwanted IP2 distortion products. The signal processing unit (20) may perform filtering, analog-to-digital converting and digital signal processing functions and the weighted power signal can be generated internally to the digital signal processing unit (20) and subtracted numerically from the digitized I,Q signals, for example.

The signal processing unit (20) may include an analog-to-digital converting function for converting the down converted signals (I,Q) and the power signal P to corresponding sample streams. The signal processing unit (20) may subtract weighted versions of the power signal P from the down converted signals (I,Q) using an I-weighting coefficient and a Q-weighting coefficient to produce the compensated output signal 14. Thereafter, the signal processing unit (20) may continuously adjust the I- and Q-weighting coefficients to cancel second order distortion terms present in the down converted signal (I,Q) to optimize cancellation of the unwanted signal. The signal processing unit (20) is thereby used to optimize control of the output signal (14) by determining residual cancelled distortion components by correlating the compensated signals (I,Q) with the power signal P.

What is claimed is:

1. A homodyne radio receiving apparatus comprising:
   an antenna for receiving an incoming signal;
   a bandpass filter connected to said antenna for limiting the bandwidth of said incoming signal to produce a filtered signal;
   an amplifier connected to said filter for amplifying said filtered signal to produce an amplified signal;
   a down converter connected to said amplifier for converting said amplified signal to complex baseband signals I and Q;
   a power detector connected to said amplifier for producing a power signal related to total received signal power amplified by said amplifier, and
   a signal processor connected to said down converter and to said power detector for processing said I,Q signals and said power signal to produce a desired output signal in which corruption due to second order intermodulation in said amplifier and said down converter has been compensated.

2. A homodyne radio receiving apparatus according to claim 1, wherein said power detector is a square-law detector.

3. A homodyne radio receiving apparatus according to claim 1, wherein said power detector is connected to said amplifier by a directional coupler at the input of said amplifier.

4. A homodyne radio receiving apparatus according to claim 1, wherein said power detector is connected to said amplifier by a directional coupler at the output of said amplifier.

5. A homodyne radio receiving apparatus according to claim 1, wherein said power detector is connected to said amplifier by a signal pick-off unit at the input of said amplifier.

6. A homodyne radio receiving apparatus according to claim 1, wherein said power detector is connected to said amplifier by a signal pick-off unit at the output of said amplifier.

7. A homodyne radio receiving apparatus according to claim 1, wherein said signal processor comprises filters for filtering said I,Q signals and said power signal.

8. A homodyne radio receiving apparatus according to claim 1, wherein said signal processor comprises an analog-to-digital converter for converting said I,Q signals and said power signal to corresponding numerical sample streams.

9. A homodyne radio receiving apparatus according to claim 1, wherein said signal processor subtracts weighted versions of said power related signal from said I,Q signals using an I-weighting coefficient and a Q-weighting coefficient to produce compensated I,Q signals.

10. A homodyne radio receiving apparatus according to claim 9, wherein said signal processor adjusts said I- and Q-weighting coefficients to cancel second order distortion terms present in said I,Q signals caused by unwanted signals.

11. A homodyne radio receiving apparatus according to claim 10, wherein said signal processor adaptively adjusts said I- and Q-weighting coefficients to continuously optimize cancellation of the second order distortion terms.

12. A homodyne radio receiver according to claim 11, wherein said signal processor controls optimization by determining residual uncancelled distortion components by correlating said I,Q signals or said compensated I,Q signals with said power signal.

13. A homodyne radio receiving apparatus according to claim 12, wherein said signal processor performs correlation numerically using digitized sample streams corresponding to said I,Q signals and power signals.

14. A homodyne radio receiver according to claim 1, wherein said signal processor compensates for DC offsets present in the output of said down converter.

15. A homodyne radio receiver according to claim 14, wherein said signal processor compensates for DC offset by differentiation and digitization of said I,Q signals.

16. A homodyne radio receiver according to claim 15, wherein said signal processor further compensates for DC offset by numerical re-integration of said differentiated and digitized I,Q signals.

17. A homodyne radio receiver according to claim 1, wherein said signal processor compensates for DC offset by DC blocking and digitization of said I,Q signals.

18. A homodyne radio receiver according to claim 17, wherein said signal processor further compensates for DC offset by estimating errors in wanted I,Q components of said I,Q signals caused by said DC blocking.

19. A homodyne radio receiver according to claim 18, wherein said signal processor subtracts out the estimated errors from said I,Q components.

20. A signal processor for compensating second order distortion in a homodyne radio receiver, comprising:
   a signal input source for receiving real and imaginary signals related to an incoming signal produced by the homodyne receiver;
   an input compensator for developing a power signal related to a total received power of the received signal;
   a weighting processor for generating weighted versions of said power signal; and
   a combiner for combining said weighted versions with said real and imaginary signals respectively to produce signals compensated for second order distortion in the homodyne receiver.

21. A signal processor according to claim 20, wherein said input compensator comprises a square-law detector for producing said power signal.

22. A signal processor according to claim 21, wherein said square-law detector is a Gilbert cell.

23. A signal processor according to claim 20, wherein said input compensator comprises a linear detector for producing said power signal.

24. A signal processor according to claim 20, wherein said combiner comprises a squaring unit for producing signals compensated for second order distortion.

25. A signal processor according to claim 20, wherein said signal input source comprises an analog-to-digital converter.

26. A signal processor according to claim 20, wherein said input compensator comprises an analog-to-digital converter.

27. A homodyne radio receiving apparatus comprising:
   a signal receiver for receiving an incoming signal;
   a down converter for converting said incoming signal to real and imaginary signals based on said incoming signal;
   a power detector for developing a power signal related to a total received signal power of said incoming signal; and
   a signal processor for correlating said real and imaginary signals with said power signal to produce signals compensated for second order distortion in the homodyne receiver.

28. A homodyne radio receiving apparatus according to claim 27, wherein said signal receiver comprises:

an antenna;

a bandwidth filter connected to said antenna for limiting the bandwidth of said incoming signal to produce a filtered signal;

a directional coupler for directing part of said filtered signal to said power detector; and an amplifier for amplifying said filtered signal.

29. A homodyne radio receiving apparatus according to claim 27, wherein said signal processor develops first and second weighted values from said compensated signal which are used for adjusting said real and imaginary signals.

30. A homodyne radio receiving apparatus according to claim 28, wherein said first and second weighted values are fed back to weighting units to produce said compensated signals.

31. A method for compensating second order distortion in a homodyne radio receiver, comprising the steps of:

(a) receiving real and imaginary signals related to an incoming signal produced by the homodyne receiver;

(b) developing a power signal related to a total received power of the received signal;

(c) generating weighted versions of said power signal; and (d) combining said weighted versions with said real and imaginary signals respectively to produce signals compensated for second order distortion in the homodyne receiver.

32. A method for compensating second order distortion according to claim 31, wherein said step (c) generates weighted versions of said power signal by adaptively adjusting real and imaginary weighting coefficients to continuously optimize cancellation of second order distortion.

* * * * *